United States Patent

Park

Patent Number: 5,770,877
Date of Patent: Jun. 23, 1998

[54] SEMICONDUCTOR MEMORY DEVICE AND METHOD FOR FABRICATING THE SAME

[75] Inventor: Keun Hyung Park, Chungcheongbuk-do, Rep. of Korea

[73] Assignee: LG Semicon Co., Ltd., Chungcheongbuk-Do, Rep. of Korea

[21] Appl. No.: 632,162

[22] Filed: Apr. 15, 1996

[30] Foreign Application Priority Data

Nov. 23, 1995 [KR]  Rep. of Korea .................. 43304/1995

[51] Int. Cl.⁶ .................................................. H01L 29/788
[52] U.S. Cl. .......................... 257/315; 257/316; 257/295
[58] Field of Search .................................... 257/314, 315, 257/316, 295

[56] References Cited

U.S. PATENT DOCUMENTS

| | | | |
|---|---|---|---|
| 5,265,059 | 11/1993 | Wells et al. .............................. | 365/204 |
| 5,291,046 | 3/1994 | Kumakura ............................... | 257/316 |
| 5,315,546 | 5/1994 | Ochii ...................................... | 365/185 |
| 5,365,098 | 11/1994 | Miyamoto et al. ..................... | 257/316 |

*Primary Examiner*—Sara W. Crane
*Assistant Examiner*—Douglas A. Wille
*Attorney, Agent, or Firm*—Morgan, Lewis & Bockius LLP

[57] ABSTRACT

A semiconductor memory device includes a semiconductor substrate of a first conductivity-type, a first electrode formed on the semiconductor substrate for charging/discharging charges, a second electrode formed on the first electrode for controlling charging/discharging and data reading/writing of the first electrode, and a charge input/output stage formed on the semiconductor substrate on at least one side of the second electrode for supplying charges.

7 Claims, 20 Drawing Sheets

F I G.5a
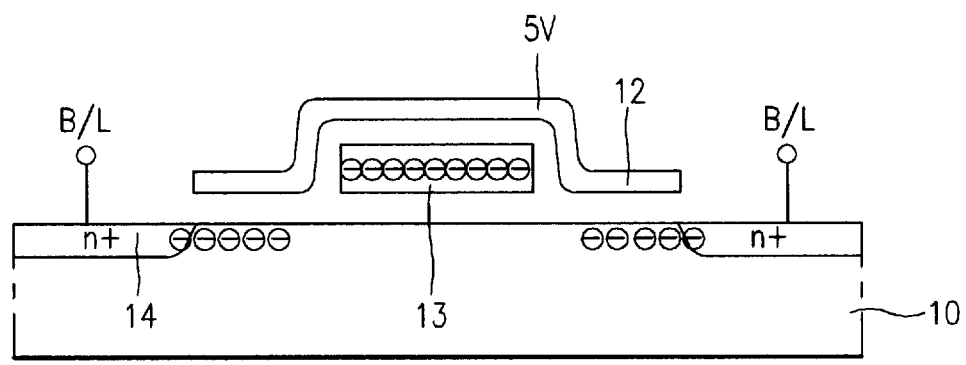
F I G.5b
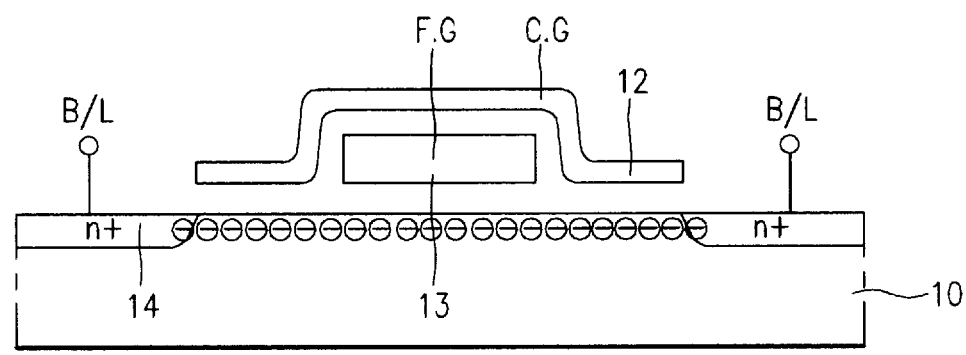

F I G.8
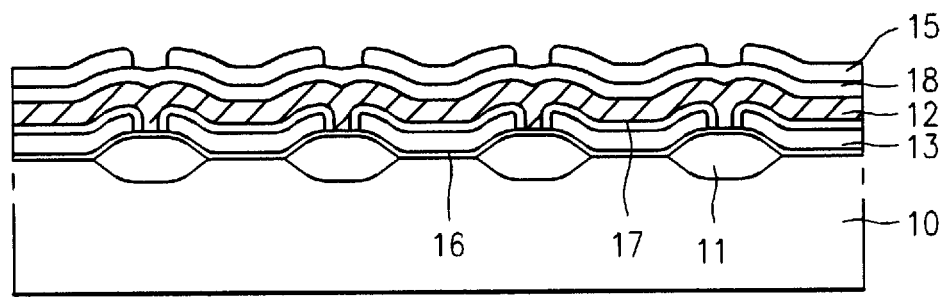
F I G.9
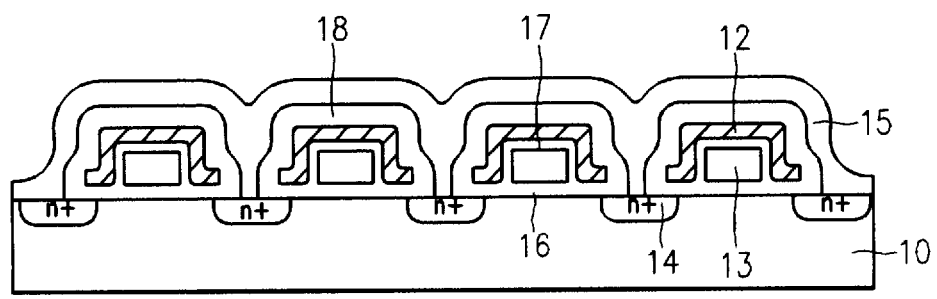

F I G. 14
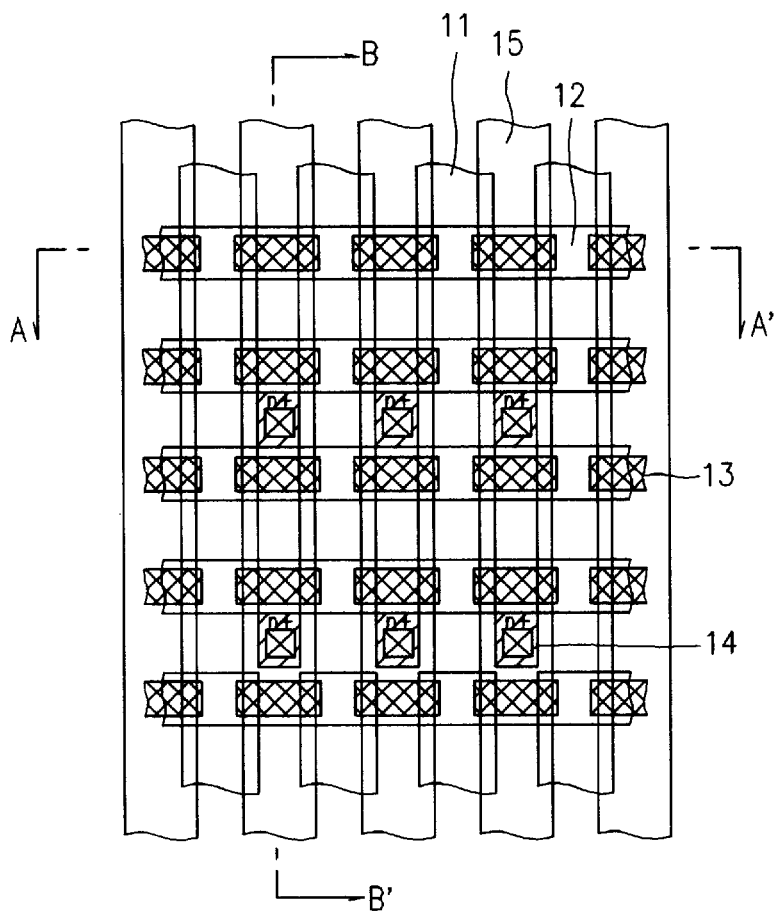
F I G. 15
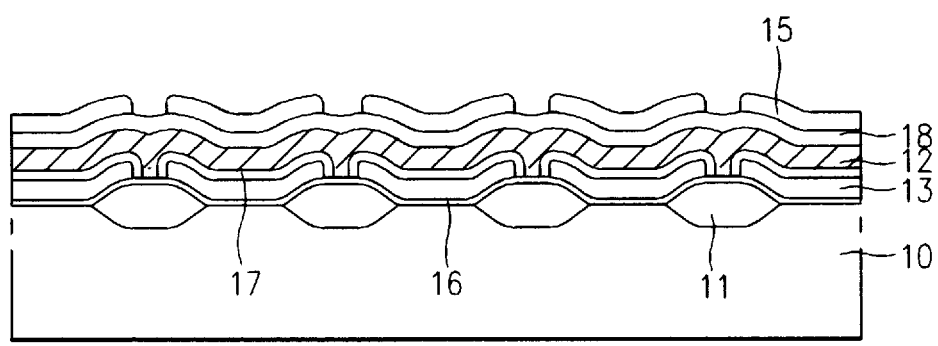

F I G.17f
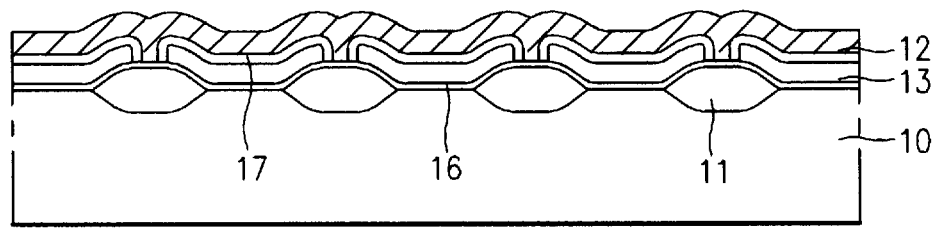
F I G.17g
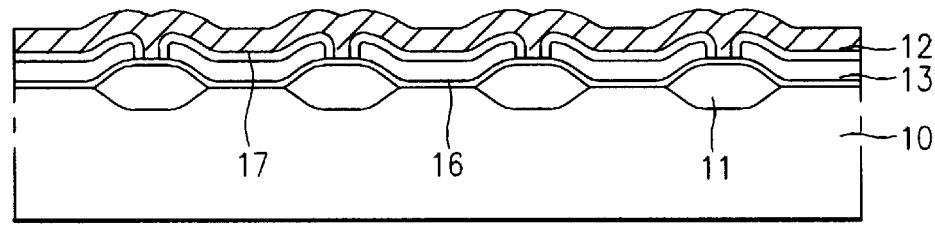
F I G.17h
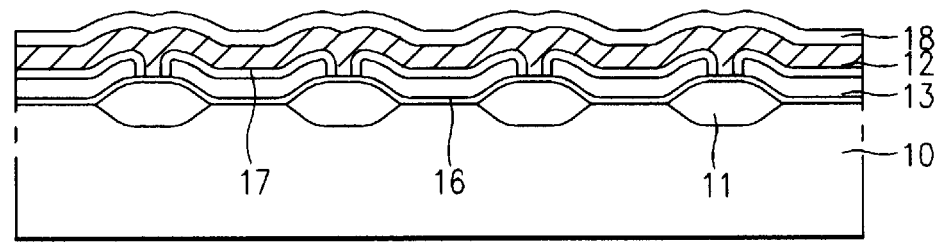
F I G.17i
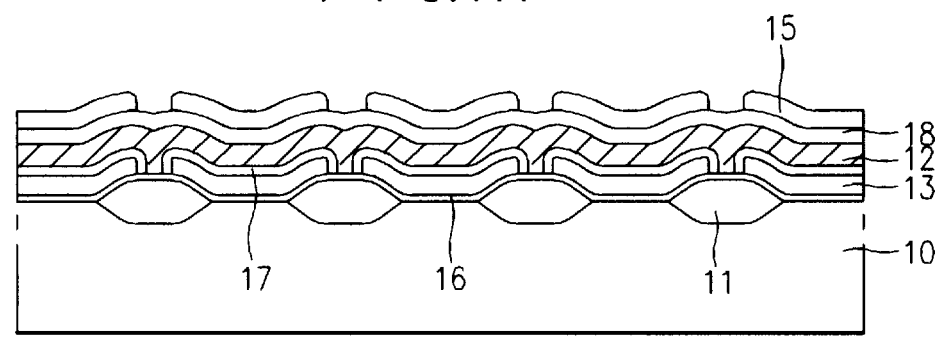

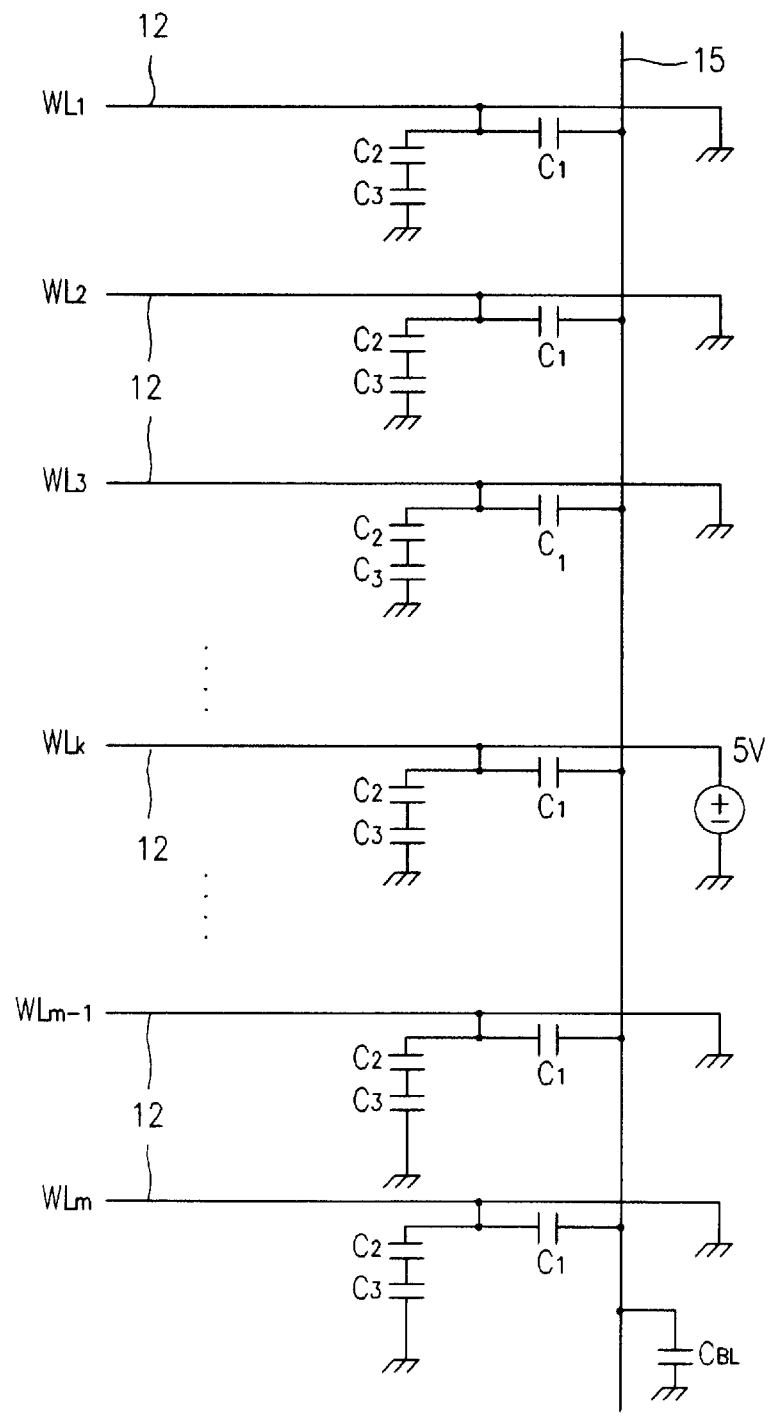
F I G.19

SEMICONDUCTOR MEMORY DEVICE AND METHOD FOR FABRICATING THE SAME

BACKGROUND OF THE INVENTION

1. Field of the Invention

The present invention relates to a semiconductor device, and more particularly, to a semiconductor memory device.

2. Discussion of the Related Art

Flash memory, a nonvolatile semiconductor memory, has received much attention in the semiconductor memory industry recently because flash memory is expected to replace the hard disk drive (HDD), which is an external storage that is currently the most widely used type in computer systems. For cache memory and the main storage of a computer, SRAM and DRAM electronically enabling reading/writing are currently used. However, they are volatile and lose stored data when power is off. Consequently, computer systems require additional external nonvolatile memory.

Presently, for external storage disks such as HDD, or magnetic memory such as magnetic tape primarily are used. However, magnetic memories are heavy, slow data readers, large power consumers, subject to external impacts, and difficult to miniaturize. Prior to flash memory, only magnetic memory was capable of enabling electrical reading/writing and was less expensive than EEPROMs, a nonvolatile memory.

With the flash memory capable of electrical reading/writing and much cheaper than the conventional EEPROM, and with gradually widely distributed portable computers requiring miniaturization, weight reduction, low power consumption, and high impact-resistance, there has been a worldwide trend to replace HDD with flash memory. System makers are currently using PCMCIA flash memory cards for auxiliary HDD memory while using the conventional HDD for personal computer systems because HDD and flash memory have a large difference in cost. However, if 64M flash memory is produced in mass quantities, the cost difference between the flash memory and HDD will be reduced below one-third of the present difference. Consequently, PCMCIA flash memory card will be used, instead of HDD, for the main external storage of portable computers. Besides, the flash memory will be used as a storage in a variety of applications such as in communication equipment including telephones, pagers, facsimiles, LANs, televisions, VCRs, game machines, cameras, audio players, car components, military electronic equipment, and medical instruments.

An EEPROM of the conventional memory device will be explained with reference to the attached drawings.

FIG. 1 shows a circuit configuration of a conventional EEPROM, and specifically, a unit cell of INTEL's ETOX flash EEPROM, which is one of the most typical flash EEPROMs.

A general EEPROM cell is made in the floating-gate avalanche-injection metal oxide semiconductor (FAMOS) configuration having a stacked gate MOSFET. The respective cell's control gate C.G is connected to a single wordline W/L, drain D is connected to a single bitline B/L, and source S is connected to a single common source line C.S.

Bitline B/L is connected to one input port of a sense AMP SA. The other input port of the sense AMP is coupled to a reference voltage $V_{ref}$. The structure of the general EEPROM cell is shown in FIG. 2.

Referring to FIG. 2, floating gate F.G and control gate C.G are stacked sequentially on P-type silicon substrate 1. Source S and drain D are formed of N-type impurity regions on substrate 1 at both sides of floating gate F.G. Here, an insulating layer is formed between substrate 1 and floating gate F.G and between the floating gate and control gate C.G. Between floating gate F.G and control gate C.G, the insulating layer is formed as thick as the gate insulating layer of a general transistor. Between floating gate F.G and silicon substrate 1, a tunnel oxide layer is formed below 100Å.

The operation of the conventional flash EEPROM will be described below. FIG. 3 shows the writing of data in the conventional EEPROM, and FIG. 4 shows the erasure of data in the conventional EEPROM.

To write data "1" in a cell, as shown in FIG. 3, a voltage of 7–8V is applied to bitline B/L corresponding to the cell, and a voltage pulse of 12–13V is applied to wordline W/L (control gate). Source S and the substrate are grounded. In this situation, avalanche breakdown is caused at the PN junction between drain D and the substrate, producing hot electrons. Some of the hot electrons obtain an energy larger than the energy barrier (about 3.2 eV) between the substrate and tunnel oxide layer, and enter floating gate F.G via the tunnel oxide layer from the substrate to be stored therein. This method is called channel hot electron injection.

Here, as the number of electrons stored in floating gate F.G increases, the cell's threshold voltage increases. Therefore, writing is performed so that generally the cell's threshold voltage becomes greater than 7V. Once the electrons are accumulated in floating gate F.G, the natural electron emission rate is sufficiently small to be ignored. Therefore, the number of accumulated electrons is maintained constant for years because the energy barrier between floating gate F.G and the insulating layer completely surrounding the floating gate is greater than 3 eV. This state of the cell indicates logic "1" in binary.

The erasure data written in a cell will now be explained as follows.

As shown in FIG. 4, the substrate and control gate C.G are grounded, the drain is floated, and a voltage pulse of 12–13V is applied to a common source line C.S. Due to Fowler-Nordheim tunnelling, electrons accumulated in floating gate F.G are induced to source S via a thin gate oxide layer. Here, as the quantity of emitted electrons from the floating gate F.G increases, the cell's threshold voltage gradually decreases. In this manner, erasure is continued until the cell's threshold voltage is below 3V. This state indicates logic "0" in binary.

The reading of data accumulated in a cell will now be described.

A voltage of 1–2V is applied to bitline B/L connected to cell's drain D, and the substrate and source S are grounded. A voltage pulse of 3–5V is applied to wordline W/L connected to cell's control gate C.G. Here, if a "1" is stored in the cell, the cell is OFF so the charges stored in bitline B/L are not emitted, thereby maintaining the previously applied voltage of 1–2V.

If a "0" is stored in the cell, the cell is ON so the charges stored in bitline B/L are emitted to ground. Such a potential difference of bitline B/L is recognized by sense AMP SA of FIG. 1 connected to bitline B/L so that data accumulated in the cell is read.

In the conventional ETOX flash EEPROM, random access is enabled in data reading, and data reading time is relatively short. Despite those advantages, the conventional ETOX flash EEPROM has many drawbacks to solve. Some of the drawbacks will now be explained.

First, when data is stored in the cell the control gate and substrate are grounded, and a high voltage of 13V is applied to the source so that a voltage is not externally applied to the drain. Thus, there is a large voltage difference between the source and substrate. In the source junction, band-to-band tunneling and avalanche breakdown are caused. Accordingly, many pairs of electron-valence electron are produced at the source junction. Some of the pairs are accelerated by an electric field at a deep depletion region formed at the source junction so that they become valence electrons with high energies (hot holes) and are implanted into the tunnel oxide layer. Some are captured by the gate oxide layer. These captured valence electrons increase tunneling rate in erasing.

For this reason, the erasing threshold voltage of the cells in which valence electrons are captured in the tunnel oxide layer becomes sharply lower than that of usual cells in which valence electrons are not captured in the gate oxide layer. As a result, the erasing threshold voltage may be negative. In this case, leakage current flows through the cells, thereby causing errors in data reading. This is called overerasing.

Bad bits whose threshold voltage becomes too low after erasure due to valence electron capture in the gate oxide layer do not always remain as bad bits. Considerable numbers of the bad bits return to normal cells because valence electrons held by the tunnel oxide layer are lost by recombining with electrons passing through the tunnel oxide layer in later erasures. However, as the cycle of program/erasure proceeds, some initially normal cells become bad.

As explained above, one cannot predict when or in which of the cells the capture of valence electrons in the gate oxide layer will occur. For this reason, devices which may cause this problem cannot be checked in a screening test performed after the fabrication process.

In order to reduce such overerasing, as shown in FIGS. 3 and 4, the conventional ETOX flash EEPROM is made so that the source junction is a deep graded junction, thereby reducing hot holes in erasure. Even in this case, the hot holes cannot be prevented completely. In addition, the deeply formed source junction increases the area of the unit cell.

Secondly, in programming a cell, the wordlines of other unselected cells coupled to the bitline of the programmed cell are grounded. A voltage of about 7 to 8V is applied to the drain. Among the unselected cells, previously programmed cells have electrons stored in the floating gate so that the potential of the floating gate becomes about −2 to −3V.

Between the drain and floating gate of unselected but previously programmed cells, a large voltage difference of about 9–10V is formed so that the electrons of the floating gate are emitted to the drain, or hot holes produced at the drain junction are implanted into the floating gate, according to Fowler-Nordheim tunnelling. Consequently, lost electrons are stored in the floating gate.

Thirdly, the conventional ETOX flash EEPROM performs programming using the channel hot electron injection. When programming is performed using this method, a high voltage of about 6–8V is applied to a bitline coupled to a cell selected for programming. About 100 $\mu$A of current flows through the bitline. This consumes a large amount of power in programming.

SUMMARY OF INVENTION

Accordingly, the present invention is directed to a semiconductor memory device that substantially obviates one or more of the problems due to limitations and disadvantages of the related art.

An object of the present invention is to provide a semiconductor memory device, and a corresponding fabrication method, for reducing power consumption, data loss, and the cell size for high packaging density.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory device includes a semiconductor substrate of a first conductivity-type; a first electrode formed on the semiconductor substrate for charging/discharging charges; a second electrode formed on the first electrode for controlling charging/discharging and data reading/writing of the first electrode; and a charge input/output stage formed on the semiconductor substrate on at least one side of the second electrode for supplying charges.

In another aspect, the semiconductor memory device includes a semiconductor substrate of a first conductivity-type used as a first electrode of a first capacitor; a first conductive region formed on the semiconductor substrate as a second electrode of the first capacitor and as a first electrode of a second capacitor; a second conductive region formed on the first conductive region as a second electrode of the second capacitor; and a charge input/output stage formed on the semiconductor substrate on one side of the second conductive region for supplying charges to be accumulated in the first conductive region.

In another aspect, the semiconductor memory device includes a unit cell formed as a stacked gate-MOS capacitor in which a floating gate and a control gate are stacked on a substrate, and an impurity region as a charge input/output stage is formed on the substrate on a side of the control gate.

In another aspect, the semiconductor memory device includes a semiconductor substrate of a first conductivity-type; a field insulating layer formed on the semiconductor substrate so that a plurality of active regions are formed in one direction at predetermined intervals; a plurality of wordlines formed above the semiconductor substrate at predetermined intervals perpendicular to the active regions; a plurality of floating gates formed between the wordlines and on the active regions of the semiconductor substrate; a charge input/output stage formed on the active regions between the wordlines; and a plurality of bitlines formed on the wordlines above the active regions perpendicular to the wordlines.

In another aspect, a semiconductor substrate of a first conductivity-type having a field region; a field insulating layer formed on the field region so that a plurality of active regions are formed in one direction at predetermined intervals; a plurality of charge input/output stages formed on the semiconductor substrate of the active regions at predetermined intervals; a tunnelling dielectric layer formed on the semiconductor substrate, the tunnelling dielectric layer having a contact hole in the charge input/output stage; a plurality of floating gates formed in a matrix arrangement on the tunnelling dielectric layer above the active regions between the charge input/output stages; a ferroelectric layer formed on the surface of the semiconductor substrate including the floating gates, the ferroelectric layer having a contact hole at the charge input/output stage; a plurality of wordlines each formed on the ferroelectric layer above the floating gates perpendicular to the active regions; an interlevel insulating layer formed on the wordlines, the interlevel insulating layer having a contact hole in the charge input/output stage; and a plurality of bitlines formed on the interlevel insulating layer to electrically connect the charge input/output stages formed on the same active region.

In another aspect, the method for fabricating a semiconductor memory device on a semiconductor substrate includes the steps of forming a tunnelling dielectric layer on the semiconductor substrate; forming a floating gate on the tunnelling dielectric layer; forming a ferroelectric layer on the tunnelling dielectric layer and the floating gate; forming a control gate on the ferroelectric layer above the floating gate; and forming a charge input/output stage at least on one side of the control gate.

In another aspect, the method for fabricating a semiconductor memory device on a semiconductor substrate of a first conductivity-type includes the steps of forming a field insulating layer in a field region so that a plurality of active regions are formed in one direction at predetermined intervals on the semiconductor substrate; forming a tunnelling dielectric layer on the semiconductor substrate; forming a plurality of floating gates on the tunnelling dielectric layer above the active regions at predetermined intervals; forming a ferroelectric dielectric layer on the tunnelling dielectric layer and the floating gate; forming a plurality of wordlines on the ferroelectric dielectric layer, each of the plurality of wordlines controlling respective floating gates perpendicular to the active regions; forming a high-concentration second conductivity-type impurity region on the active regions between the wordlines; depositing an interlevel insulating layer on the ferroelectric dielectric layer and the wordlines; forming a contact hole to expose the high-concentration second conductivity-type impurity region; and forming a plurality of bitlines on the interlevel insulating layer electrically coupled to the high-concentration second conductivity-type impurity region.

In another aspect, the method for fabricating a semiconductor memory device on a semiconductor substrate of a first conductivity-type, the method comprising the steps of forming a field insulating layer in a field region so that a plurality of active regions are formed in one direction at predetermined intervals on the semiconductor substrate; forming a tunnelling dielectric layer on the semiconductor substrate; forming a plurality of floating gates on the tunnelling dielectric layer above the active regions at predetermined intervals; forming a ferroelectric dielectric layer on the tunnelling dielectric layer and the floating gates; forming a plurality of wordlines stacked by a cap insulating layer on the ferroelectric dielectric layer so that one wordline controls the floating gates perpendicular to the active regions; forming an impurity region on the active regions between the wordlines; selectively removing the ferroelectric dielectric layer and tunnelling dielectric layer using the wordlines as a mask; forming an insulating layer sidewall on a side surface of the wordlines and cap insulating layer, thereby forming a contact hole on the impurity region; and forming a plurality of bitlines electrically coupled to the impurity region.

In another aspect, the method for fabricating a semiconductor memory device on a semiconductor substrate of a first conductivity-type includes the steps of forming a field insulating layer in a field region, a plurality of active regions remaining in one direction at predetermined intervals on the semiconductor substrate; forming a tunnelling dielectric layer on the semiconductor substrate; forming a plurality of floating gates on the tunnelling dielectric layer above the active regions at predetermined intervals; forming a ferroelectric dielectric layer on the tunnelling dielectric layer and the floating gates; forming a plurality of wordlines on the ferroelectric dielectric layer, each one of the respective wordlines controlling respective floating gates perpendicular to the active regions; alternately forming maskings between the wordlines; forming a high-concentration second conductivity-type impurity region on the active regions using the wordlines and maskings as a mask; depositing an interlevel insulating layer on the ferroelectric dielectric layer and the wordlines, and forming a contact hole to expose the high-concentration second conductivity-type impurity region; and forming a plurality of bitlines on the interlevel insulating layer electrically coupled to the high-concentration second conductivity-type impurity region.

In another aspect, the method for fabricating a semiconductor memory device on a semiconductor substrate of a first conductivity-type includes the steps of forming a field insulating layer in a field region so that a plurality of active regions are formed in one direction at predetermined intervals on the semiconductor substrate; forming a tunnelling dielectric layer on the semiconductor substrate; forming a plurality of floating gates on the tunnelling dielectric layer above the active regions at predetermined intervals; forming a ferroelectric dielectric layer on the tunnelling dielectric layer and the floating gates; forming a plurality of wordlines stacked by a cap insulating layer on the ferroelectric dielectric layer so that one wordline controls the floating gates perpendicular to the active regions; alternately forming maskings between the wordlines; forming an impurity region on the active regions using the wordlines and maskings as a mask; selectively removing the ferroelectric dielectric layer and tunnelling dielectric layer using the wordlines and maskings as a mask; forming an insulating layer sidewall on a side of the wordlines and the cap insulating layer, thereby forming a contact hole on the impurity region; and forming a plurality of bitlines electrically coupled to the impurity region.

For one aspect of the present invention, there is further provided a semiconductor memory device including a first conductivity-type semiconductor substrate; a first electrode formed on the semiconductor substrate for charging/discharging charges; a second electrode formed on the first electrode for controlling charging/discharging and data reading/writing of the first electrode; and a charge input/output stage formed on the semiconductor substrate at least on one side of the second electrode for supplying charges.

For another aspect of the present invention, there is provided a method for fabricating a semiconductor memory device including the steps of forming a tunnelling dielectric layer on a semiconductor substrate; forming a floating gate on the tunnelling dielectric layer; forming a ferroelectric layer on the overall surface of the substrate including the floating gate; forming a control gate on the ferroelectric layer above the floating gate; and forming a charge input/output stage at least on one side of the control gate.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 5a and 5b are sectional views of a unit cell for explaining the operation principles of the present invention;

FIG. 8 is a sectional view of the first embodiment of the semiconductor memory device of the present invention cut along line A-A' of FIG. 7;

FIG. 9 is a sectional view of the first embodiment of the semiconductor memory device of the present invention cut along line B-B' of FIG. 7;

FIG. 14 is a layout of the second embodiment of the semiconductor memory device of the present invention;

FIG. 15 is a sectional view of the second embodiment of the semiconductor memory device of the present invention, cut along line A-A' of FIG. 14;

FIGS. 17a–17i are sectional views of the sequential process of the second embodiment of the semiconductor memory device of the present invention cut along line A-A' of FIG. 14;

FIG. 19 shows a capacitor response circuit when data "0" is read in the semiconductor memory device.

DETAILED DESCRIPTION OF PREFERRED EMBODIMENTS

Figure 1:
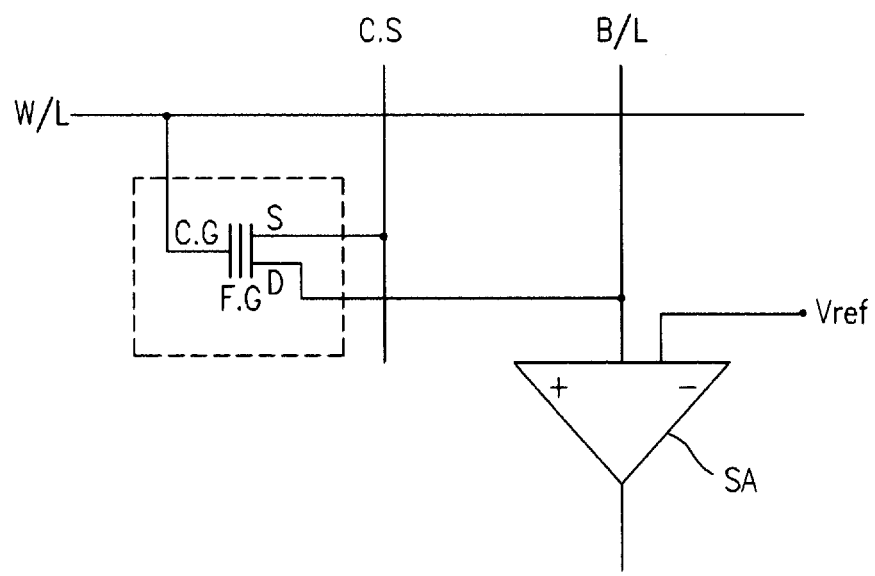
FIG. 1 is a circuit diagram of a unit cell of a conventional EEPROM.
Figure 2:
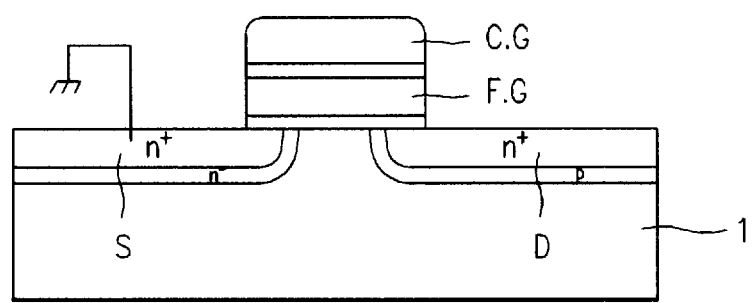
FIG. 2 is a sectional view of a unit cell in the conventional EEPROM.
Figure 3:
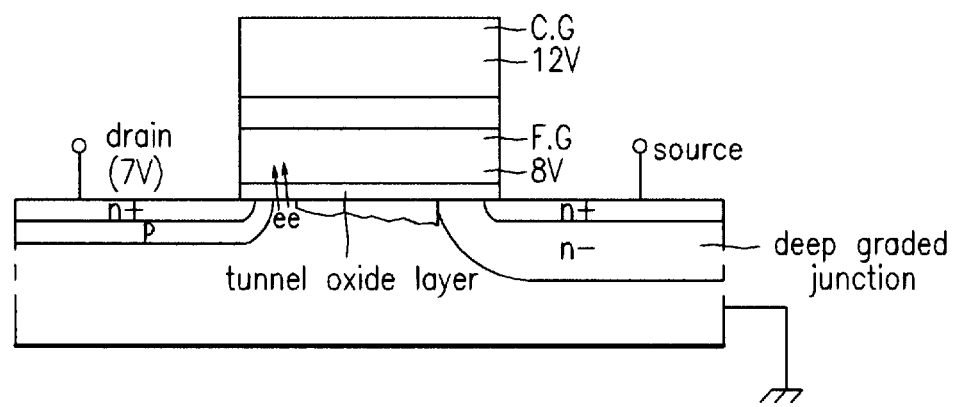
FIG. 3 illustrates an operation in which data is written in the conventional EEPROM.
Figure 4:
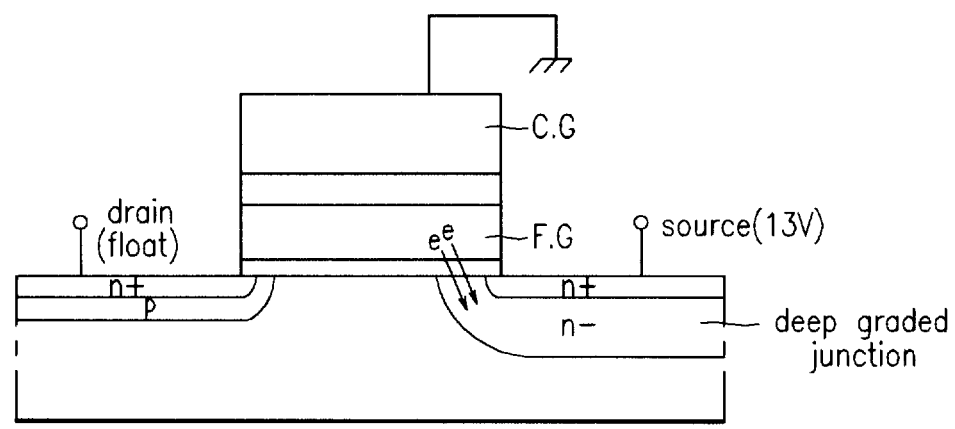
FIG. 4 illustrates an operation in which data is erased in the conventional EEPROM.

Reference will now be made in detail to the preferred embodiments of the present invention, examples of which are illustrated in the accompanying drawings.

Referring to FIGS. 5a and 5b, a unit memory cell of the semiconductor memory device of the present invention is constructed as a stacked gate-MOS capacitor, in which a floating gate 13 for charging/discharging charges and a control gate 12 for controlling charging/discharging and reading/writing are stacked, and an impurity region 14 used as a charge input/output stage is formed on a substrate 10 and at least on one side of floating gate F.G. In the drawing, the charge input/output stage is placed on both sides thereof.

In a stacked gate-MOS capacitor structure in which floating gate F.G and control gate C.G are stacked and impurity region 14 is formed on both sides of floating gate 13 and on the substrate 10, however, the semiconductor substrate 10 between impurity regions 14 is not used as a channel for transmitting charges. Instead, this structure is made so that in programming, similar to a general EEPROM, writing data "0" of "1" is performed by charging or discharging charges in the floating gate, and data reading is performed by an inversion layer which is formed or not formed on the substrate between impurity regions 14 according to whether charges are accumulated or discharged from floating gate 13 and whether a pulse is applied to control gate 12. In other words, the structure uses charging/discharging of a capacitor between control gate 12 and floating gate 13, a capacitor between floating gate 13 and the inversion layer, and a parasitic capacitor between control gate 12 and impurity region 14. As shown in FIG. 5a, when charges are stored in floating gate 13, the inversion layers are not formed on the substrate (channel area) between impurity region 14. Therefore, charges are not accumulated in the substrate between impurity region 14.

As shown in FIG. 5b, when charges are not accumulated in floating gate F.G, the inversion layer is formed on the substrate between impurity region 14. Consequently, charges are stored in the substrate between impurity region 14 on which the inversion layer is formed.

The configuration of the semiconductor memory device of the present invention whose unit cell is formed with a stacked gate-MOS capacitor will now be described.

Figure 6:
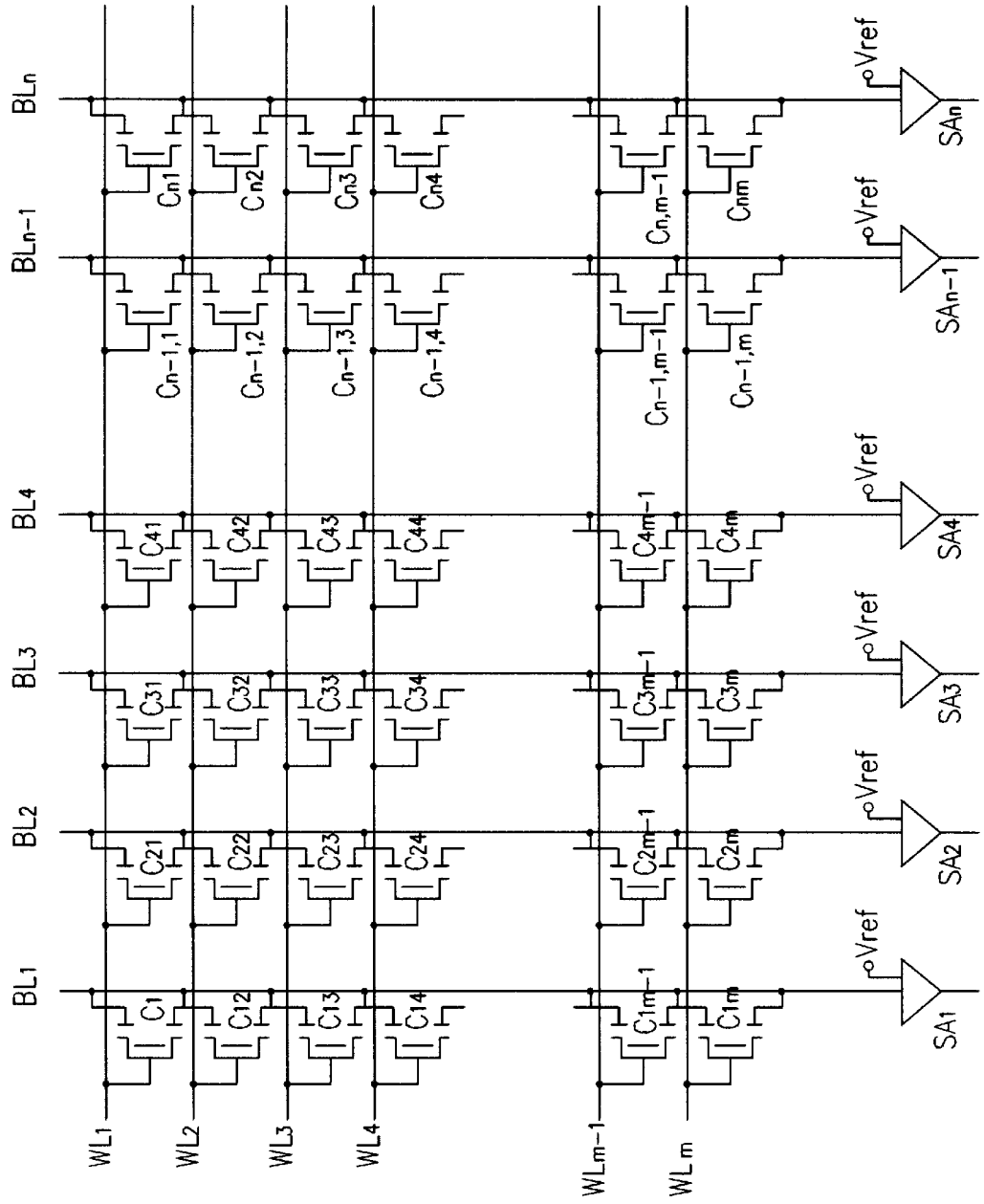
FIG. 6 is a circuit diagram of the first embodiment of the semiconductor memory device of the present invention.

The first embodiment of the semiconductor memory device of the present invention is shown in FIG. 6. Referring to FIG. 6, this embodiment of the present invention comprises stacked gate-MOS capacitors $C_{11}$–$C_{nm}$ arranged in a matrix for programming data according to whether charges are accumulated or not in the floating gate, wordlines $WL_1$–$WL_m$ for controlling the same row of stacked gate-MOS capacitors at the same time, bitlines $BL_1$–$BL_n$ for writing and reading data from the same column of the stacked gate-MOS capacitors, and sensing AMPs $SA_1$–$SA_n$ for sensing and outputting data from bitlines $BL_1$–$BL_n$.

Here, the control gates of the same row of stacked gate-MOS capacitors are connected to a single wordline. The charge input/output stages, that is, the impurity regions, of the same column of stacked gate-MOS capacitors are connected to a single bitline. Sensing AMPs $SA_1$–$SA_n$ each take corresponding bitlines as their input ports. A reference voltage is applied to the other input port of the respective sensing AMPs $SA_1$–$SA_n$.

The structure of the first embodiment of the semiconductor memory device of the present invention will now be explained.

Figure 7:
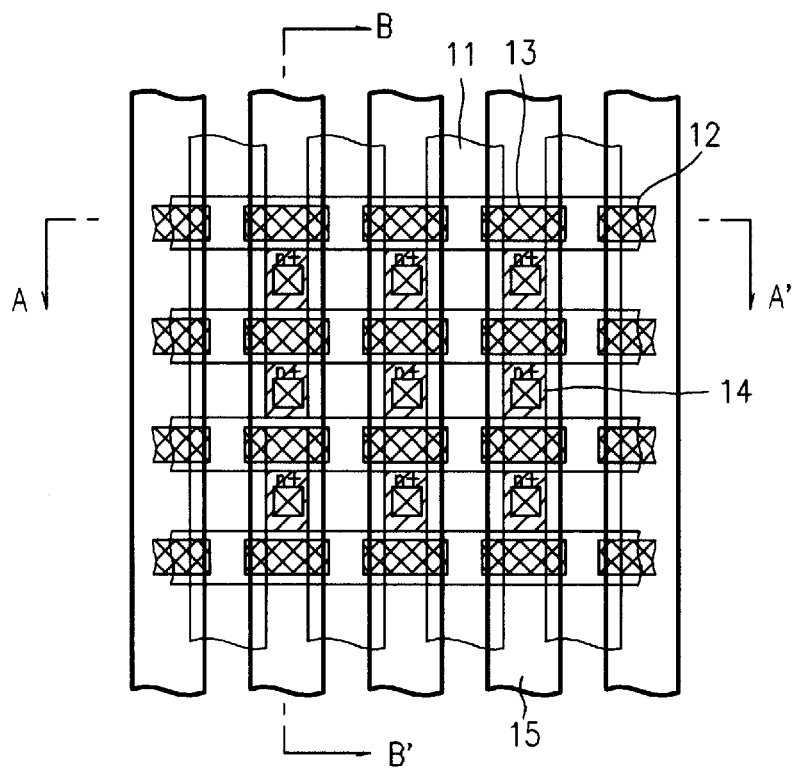
FIG. 7 is a layout of the first embodiment of the semiconductor memory device of the present invention.

The layout of the first embodiment of the semiconductor of the present invention is shown in FIG. 7 so that field insulating layers 11 are formed at predetermined intervals on a field area to make a plurality of active regions on the substrate in one direction, and a plurality of wordlines 12 are formed to the active regions at predetermined intervals on the semiconductor substrate on which field insulating layers 11 are formed.

With the semiconductor substrate placed between the field insulating layers 11 as the active regions, a plurality of floating gates 13 are formed between wordlines 12 and the active regions. High-concentration N-type impurity regions 14, that is, charge input/output stages, are formed on the active regions placed between wordlines 12. A plurality of bitlines 15 are formed between field insulating layers 11, being perpendicular to wordlines 12. Here, high-concentration N-type impurity regions 14 perpendicular to wordlines 12 are connected to a single bit line.

The sectional structure of the first embodiment of the semiconductor memory device of the present invention will now be described.

FIG. 8 shows a sectional view in the direction of wordlines 12. The device is constructed so that field insulating layers (oxide layer) 11 are formed on P-type semiconductor substrate 10 at predetermined intervals, thereby making a plurality of active regions. Through this procedure, the field areas and active regions are defined. A tunnelling dielectric layer 16 is formed on P-type semiconductor substrate 10 of the active regions. A plurality of floating gates 13 are formed on tunnelling dielectric layer 16. Here, floating gates 13 are arranged at predetermined intervals in a matrix arrangement. A ferroelectric layer 17 is formed on the overall surface of the substrate including floating gate 13. Wordlines 12 are formed on ferroelectric layer 17. An interlevel insulating layer 18 is formed on the overall surface of the substrate including wordlines 12. Bitlines 15 are formed perpendicular to wordlines 12 on interlevel insulating layer 18 placed above the active regions. Here, one wordline 12 is formed to commonly have floating gates 13 corresponding to rows perpendicular to the active regions. For tunnelling oxide layer 16 and ferroelectric layer 17, PZT (lead zirconate titanate) is preferably used.

Referring to FIG. 9, the sectional structure along bitlines 15 of the semiconductor memory device of the present invention is constructed so that tunnelling dielectric layer 16 is formed on P-type semiconductor substrate 10, and a plurality of floating gates 13 are formed on tunnelling dielectric layer 16 at a predetermined interval. Ferroelectric layer 17 is formed on the overall surface of the substrate including floating gate 13. A plurality of wordlines 12 are formed on ferroelectric layer 17 above floating gate 13. Here, wordlines 12 each are formed to embrace floating gates 13 so that the electrostatic capacity between wordlines 12 and floating gates 13 is large and that capacitance coupling is minimized between the floating gates 13 and bitlines 15. High-concentration N-type impurity region 14 is formed on P-type semiconductor substrate 10 between wordlines 12. Interlevel insulating layer 18 is formed on the overall surface of the substrate including wordlines 12, and bitlines 15 are formed on interlevel insulating layer 18. A contact hole is been formed on high-concentration N-type impurity region 14. As a result, high-concentration N-type impurity region 14 is coupled to bitline 15.

A method for fabricating the first embodiment of the present invention will now be explained.

Figure 10A:
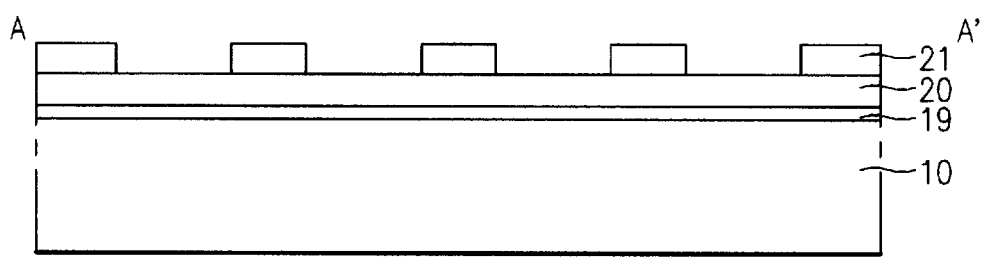
FIGS. 10a–10i are sectional views of the sequential process steps of the first embodiment of the semiconductor memory device of the present invention cut along line A-A' of FIG. 7.
Figure 11A:
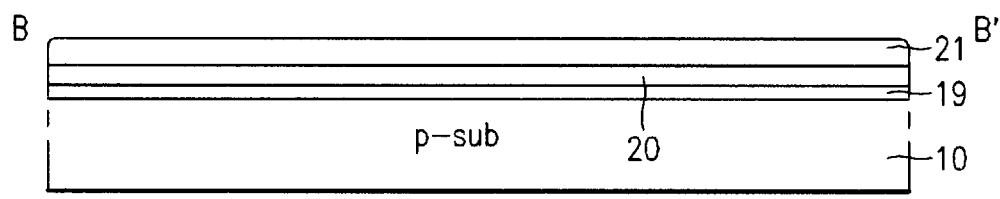
FIGS. 11a–11i are sectional views of the sequential process steps of the first embodiment of the semiconductor memory device of the present invention cut along line B-B' of FIG. 7.

Referring to FIGS. 10a and 11a, buffer oxide layer 19, nitride layer 20 and photosensitive layer 21 are deposited sequentially on P-type semiconductor substrate 10, and the field region and active regions are defined by photolithography so that the pattern of photosensitive layer 21 is formed only on the active regions.

Figure 10B:
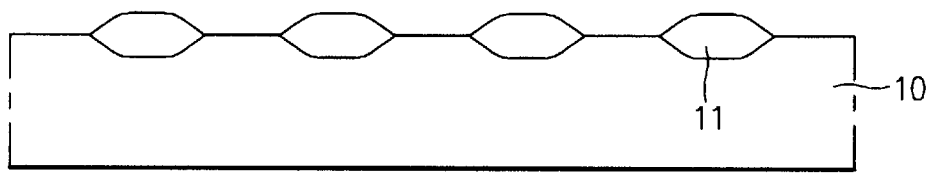
Figure 11B:
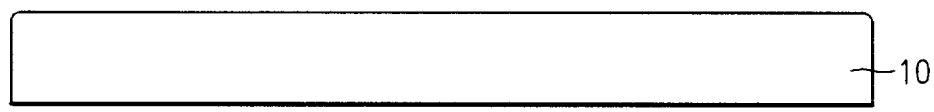

Referring to FIGS. 10b and 11b, nitride layer 20 is selectively removed using the photosensitive layer 21 as a mask and thermally treating the structure under an oxygen atmosphere so that field insulating layer (field oxide layer) 11 is formed on the field region. Then, photosensitive layer 21, nitride layer 20 and buffer oxide layer 19 are removed.

Figure 10C:
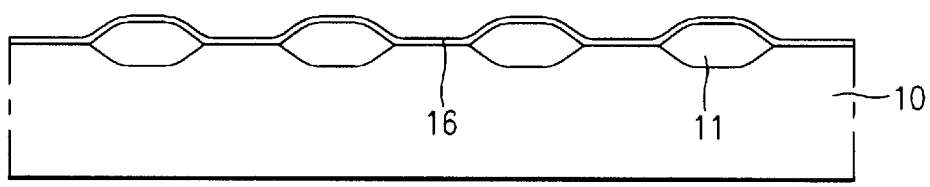
Figure 11C:
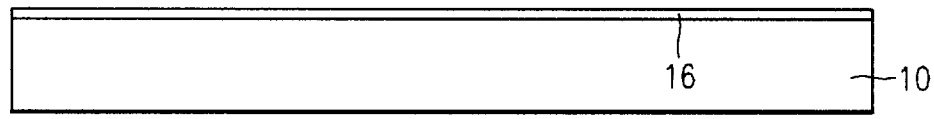

Referring to FIGS. 10c and 11c, tunnelling dielectric layer 16, such as PZT, is formed on P-type semiconductor substrate 10 on which field insulating layer 11 is formed. Here, tunnelling dielectric layer 16 must be sufficiently thick to enable tunnelling and made of a high permittivity material. The most appropriate thickness for tunnelling is 70–150Å.

Figure 10D:
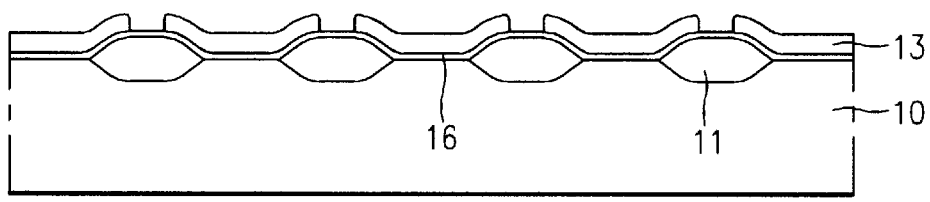
Figure 11D:
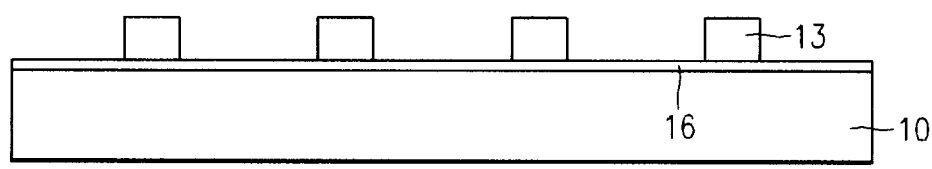

Referring to FIGS. 10d and 11d, polysilicon is deposited on tunnelling dielectric layer 16 and patterned by photolithography and etching, thereby forming floating gate 13 on tunnelling dielectric layer 16 of the active regions. Here, floating gate 13 may be formed of metal.

Figure 10E:
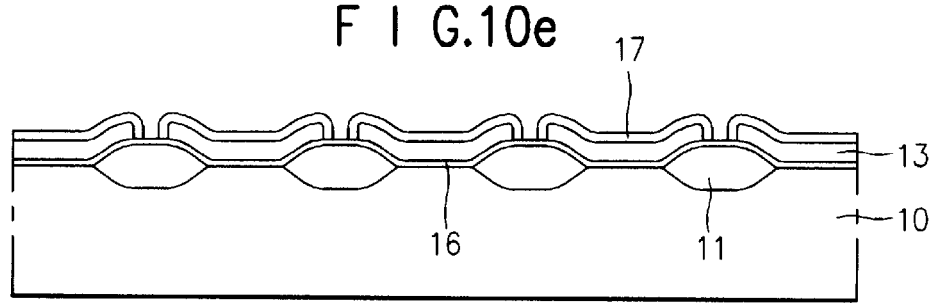
Figure 11E:
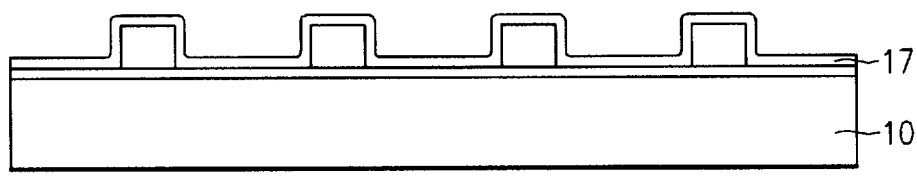

Referring to FIGS. 10e and 11e, ferroelectric layer 17 is deposited on the overall surface of the substrate including floating gate 13. Here, ferroelectric layer 17 is formed of a oxide/nitride or oxide/nitride/oxide stack, or of PZT.

Figure 10F:
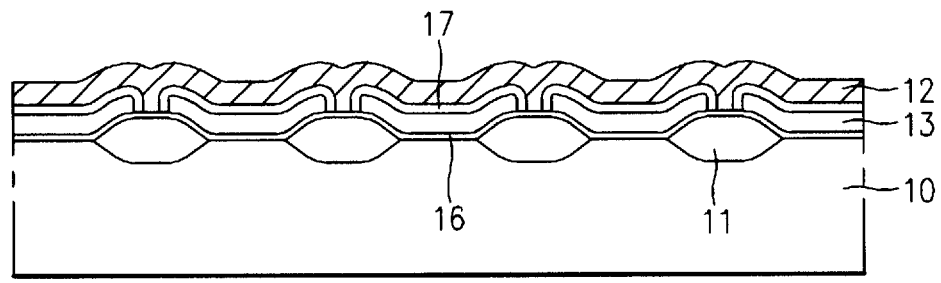
Figure 11F:
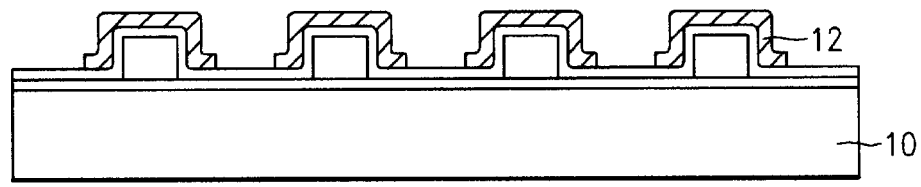

In FIGS. 10f and 11f, polysilicon is deposited on the overall surface of ferroelectric layer 17 and selectively removed by photolithography and etching so that wordlines 12 are formed above floating gate 13. Here, wordlines 12 are formed perpendicular to field insulating layer 11. One row of floating gates 13 are formed to be embraced by wordlines 12. The floating gates may be formed of metal instead of polysilicon.

Figure 10G:
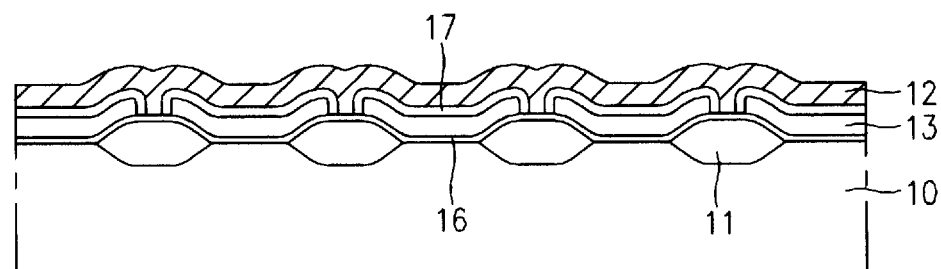
Figure 11G:
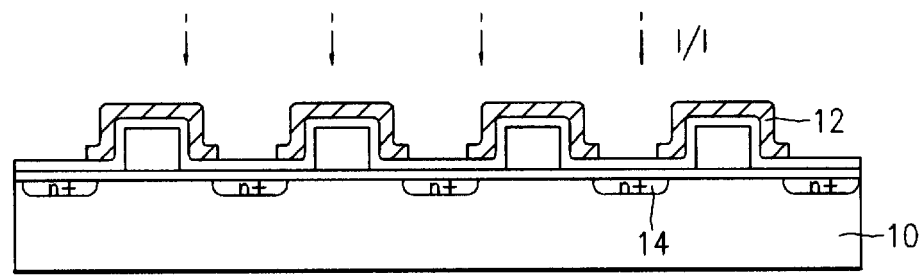

Turning to FIGS. 10g and 11g, N-type impurity ions are heavily implanted into P-type semiconductor substrate 10 of the exposed active regions using wordlines 12 as a mask, thereby forming high-concentration N-type impurity region 14 to be used as a charge input/output stage.

Figure 10H:
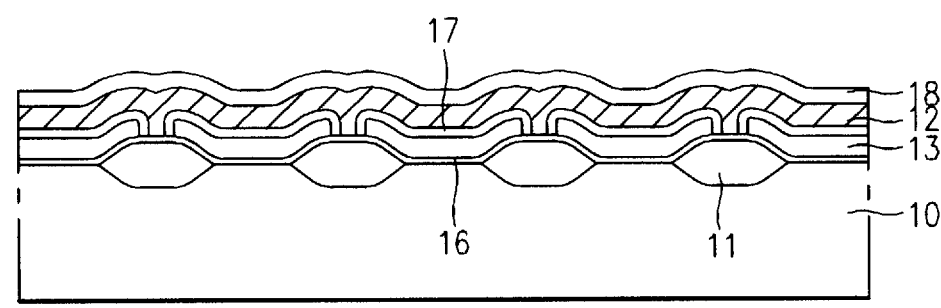
Figure 11H:
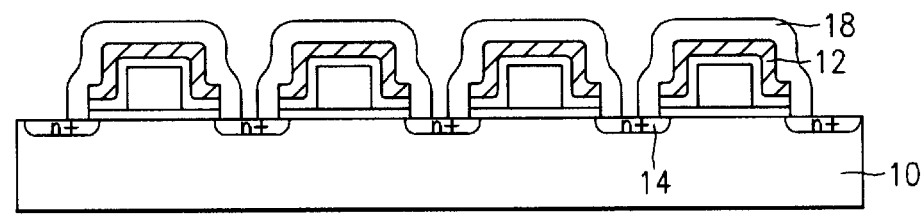

Referring to FIGS. 10h and 11h, interlevel insulating layer 18 is deposited on the overall surface of the substrate including wordlines 12, and tunnelling dielectric layer 16, ferroelectric layer 17 and interlevel insulating layer 18 are selectively removed, thereby exposing high-concentration N-type impurity region 14 and then form a contact hole.

Figure 10I:
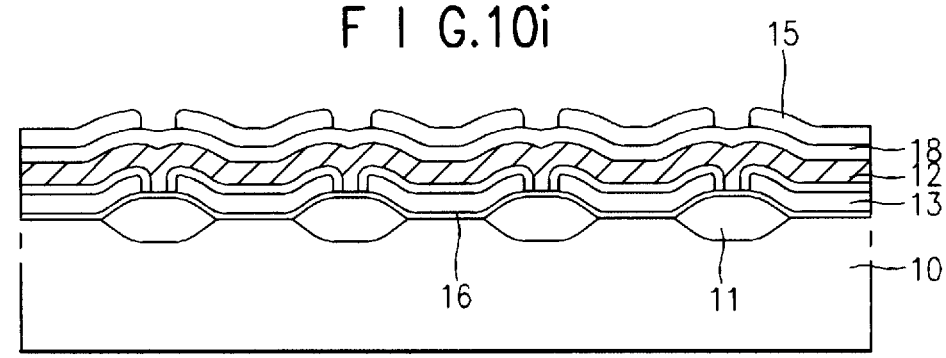
Figure 11I:
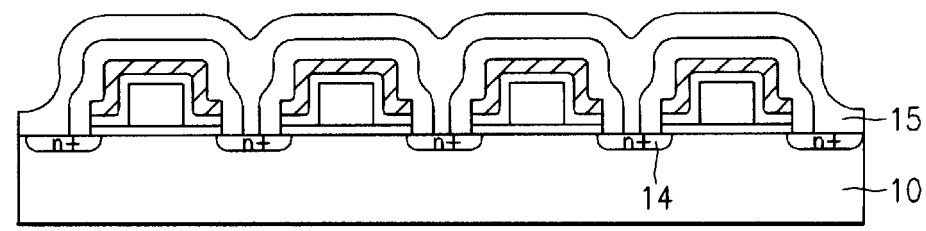

Referring to FIGS. 10i and 11i, polysilicon is deposited on interlevel insulating layer 18 and selectively removed by photolithography and etching, thereby forming bitlines 15 to be electrically coupled to high-concentration N-type impurity region 14. Here, bitlines 15 may be formed of metal. According to the above-described processes, a first embodiment of the semiconductor memory device of the present invention can be fabricated.

As shown in FIGS. 10h and 11h, masking is required to form a bitline contact hole. However, without masking, the first embodiment of the present invention can be made. This method will now be explained.

Figure 12A:
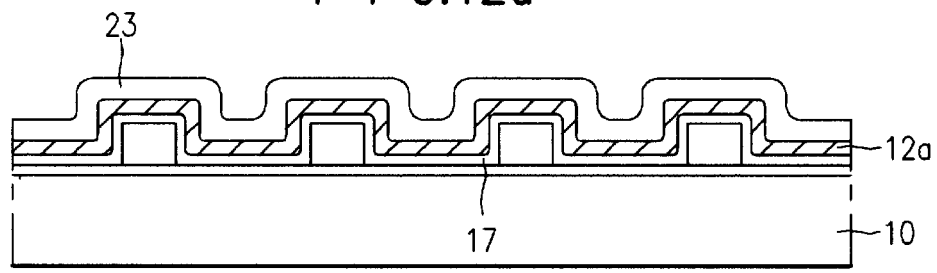
FIGS. 12a–12e are sectional views of the steps of a process of a modified first embodiment of the semiconductor memory device of the present invention.

The method of fabrication without masking has the same processes as shown in FIGS. 10e and 11e until the process for forming ferroelectric layer 17 on the overall surface of the substrate including floating gate 13. Thereafter, as shown in FIG. 12a, polysilicon 12a and cap insulating layer (oxide layer) 23 are sequentially deposited on the overall surface of ferroelectric layer 17.

Figure 12B:
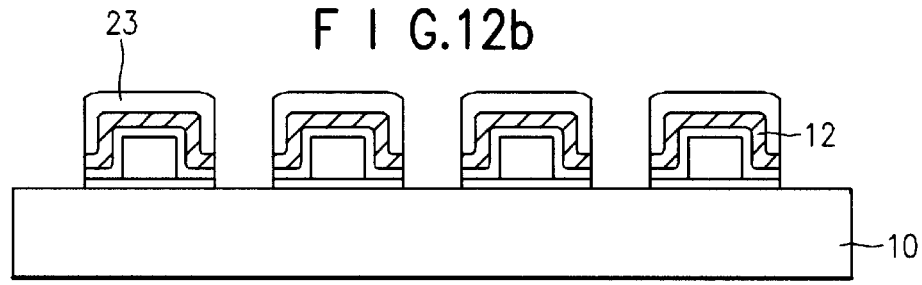

Then, as shown in FIG. 12b, using a pattern mask, cap insulating layer 23, polysilicon 12a, ferroelectric layer 17, and tunnelling dielectric layer 16 are selectively removed by photolithography and etching, thereby forming wordlines 12.

Here, the pattern mask has been used when wordlines 12 are patterned in FIGS. 10f and 11f.

Figure 12C:
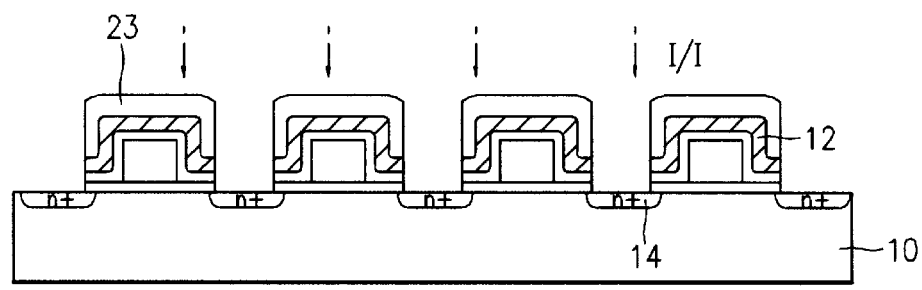

Referring to FIG. 12c, N-type impurity ions are heavily implanted onto P-type semiconductor substrate 10 of the exposed active regions using wordlines 12 as a mask so that high-concentration N-type impurity region 14 is formed as the charge input/output stage.

Figure 12D:
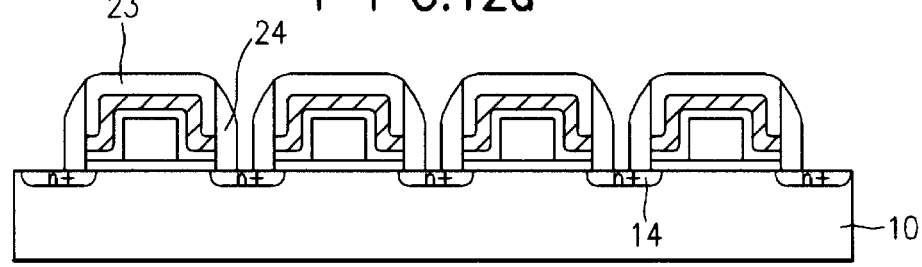

Then, in FIG. 12d, an insulating layer is deposited on the overall surface of the substrate including wordlines 12 and cap insulating layer 23, and etched back to form insulating layer sidewall 24 on the side surface of wordlines 12. Here, insulating layer sidewall 24 is formed on the side surface of wordlines 12 so that a contact hole is formed in high-concentration impurity region 14.

Figure 12E:
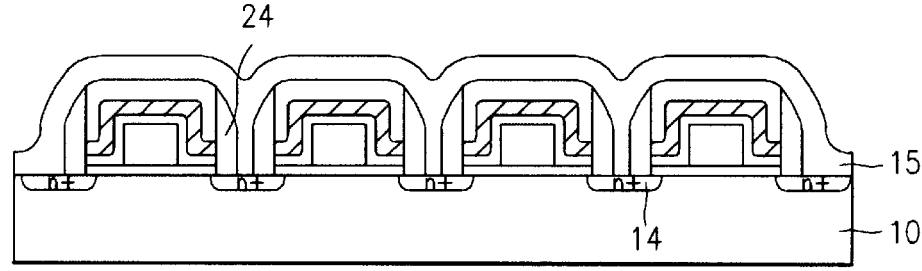

As shown in FIG. 12e, polysilicon is deposited on the overall surface of the substrate including cap insulating layer 23 and insulating layer sidewall 24, and selectively removed by photolithography and etching to form bitlines 15 to be electrically coupled to high-concentration N-type impurity region 14. Therefore, without an additional process of forming the bitline contact hole, the first embodiment of the present invention can be made.

A second embodiment of the semiconductor memory device and its fabrication method of the present invention will now be described.

First, the unit cell of the second embodiment of the semiconductor memory device of the present invention is shown in FIGS. 5a and 5b. In this embodiment, the charge input/output stage is formed on only one side of the stacked gate-MOS capacitor.

Figure 13:
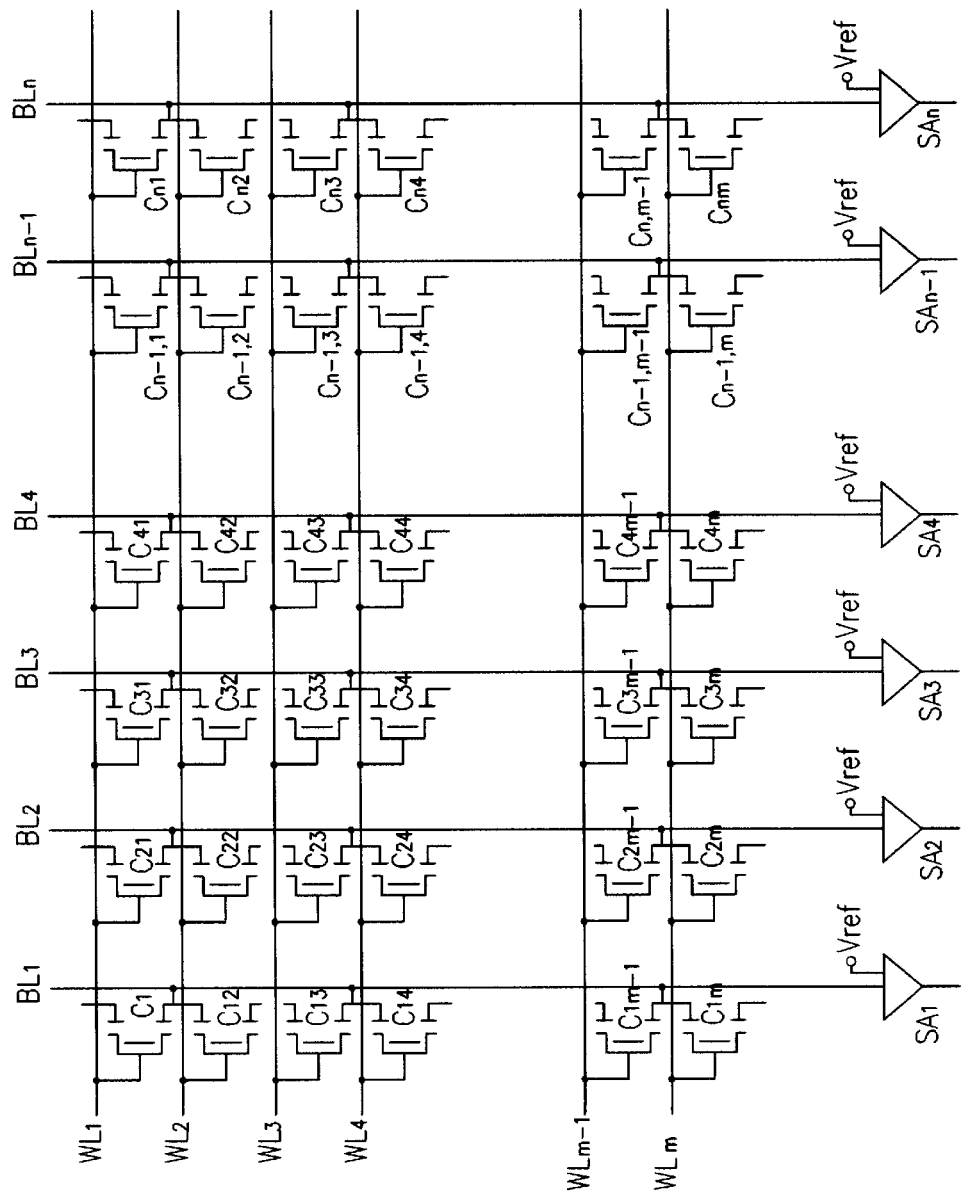
FIG. 13 is a circuit diagram of the second embodiment of the semiconductor memory device of the present invention.

The circuit configuration of the second embodiment of the semiconductor memory device of the present invention is shown in FIG. 13. Referring to FIG. 13, this embodiment of the present invention comprises stacked gate-MOS capacitors $C_{11}$–$C_{mn}$ arranged in a matrix for programming data and accumulating charges in the substrate according to whether charges are accumulated or not in the floating gate, wordlines $WL_1$–$WL_m$ for controlling the same row of the stacked gate-MOS capacitors at the same time, bitlines $BL_1$–$BL_n$ for writing and reading data from the same column of the stacked gate-MOS capacitors, and sensing AMPS $SA_1$–$SA_n$ for sensing and outputting data from bitlines $BL_1$–$BL_n$. In the stacked gate-MOS capacitor, the charge input/output stage is formed only on one side of the floating gate. However, the impurity region may be formed on both sides or only one side of the floating gate. Here, if impurity regions are formed on both sides of the floating gate, one of the impurity regions is coupled to the bitline while used as a charge input/output stage, and the other one is floated. Accordingly, the control gates of the same row of stacked gate-MOS capacitors are connected to a single wordline. The charge input/output stages are formed only on one side of the same column of stacked gate-MOS capacitors, and connected to a single bitline. Sensing AMPs $SA_1$–$SA_n$ each take corresponding bitlines as their input ports. A reference voltage is applied to the other input port of the respective sensing AMPS $SA_1$–$SA_n$.

The structure of the second embodiment of the semiconductor memory device of the present invention will now be explained.

First, the layout of the first embodiment of the semiconductor of the present invention is shown in FIG. 14 so that field insulating layers 11 are formed at predetermined intervals on a field area to make a plurality of active regions on the substrate in one direction, and a plurality of wordlines 12 are formed perpendicular to the active regions at predetermined intervals on the semiconductor substrate on which field insulating layers 11 are formed.

With the semiconductor substrate placed between field insulating layers 11 as the active regions, a plurality of floating gates 13 are formed between wordlines 12 and the active regions. High-concentration N-type impurity regions 14 are formed on the active regions placed between wordlines 12. A plurality of bitlines 15 are formed perpendicular to wordlines 12 between field insulating layers 11. Here, high-concentration N-type impurity regions 14 perpendicular to wordlines 12 are connected to a single bit line. As in the first embodiment of the present invention, impurity region 14 is formed on the active regions between the wordlines. The impurity region formed between two wordlines is coupled to a bitline.

The sectional structure of the second embodiment of the semiconductor memory device of the present invention will now be described.

FIG. 15 sectional view in the direction of wordlines 12. The device is constructed so that field insulating layers (oxide layer) 11 are formed on P-type semiconductor substrate 10 at predetermined intervals, thereby making a plurality of active regions. This procedure defines the field areas and active regions. A tunnelling dielectric layer 16 is formed on P-type semiconductor substrate 10 of the active regions. A plurality of floating gates 13 are formed on tunnelling dielectric layer 16. Here, floating gates 13 are arranged at predetermined intervals in the matrix. A ferroelectric layer 17 is formed on the overall surface of the substrate including floating gates 13. Wordlines 12 are formed on ferroelectric layer 17. An interlevel insulating layer 18 is formed on the overall surface of the substrate including wordlines 12. Bitlines 15 are formed perpendicular to wordlines 12 on interlevel insulating layer 18 placed above the active regions.

Figure 16:
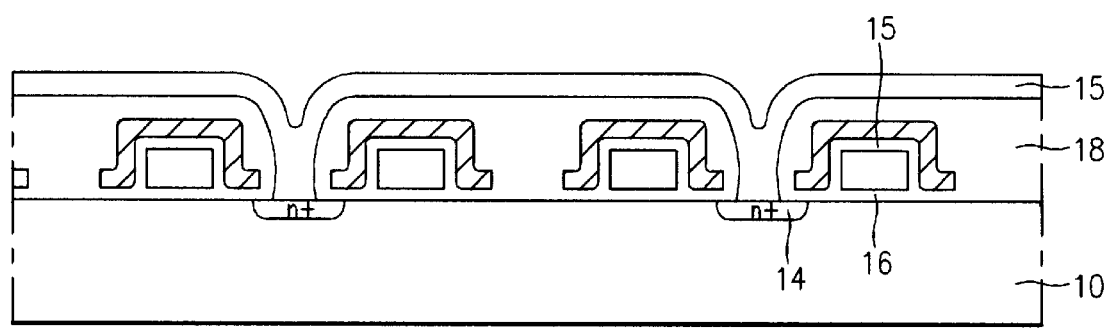
FIG. 16 is a sectional view of the second embodiment of the semiconductor memory device of the present invention cut along line B-B' of FIG. 14.

Meanwhile, referring to FIG. 16, the sectional structure of the semiconductor memory device of the present invention is constructed so that tunnelling dielectric layer 16 is formed on P-type semiconductor substrate 10, and a plurality of floating gates 13 are formed on tunnelling dielectric layer 16 at a predetermined interval. Ferroelectric layer 15 is formed on the overall surface of the substrate including floating gates 13. A plurality of wordlines 12 are formed on ferroelectric layer 17 above floating gates 13. Here, wordlines 12 each are formed to embrace floating gates 13 so that the electrostatic capacity is large between wordlines 12 and floating gates 13. High-concentration N-type impurity regions 14 are formed on P-type semiconductor substrate 10 between pairs of wordlines 12. Interlevel insulating layer 18 is formed on the overall surface of the substrate including wordlines 12, and bitlines 15 are formed on interlevel insulating layer 18. Here, contact holes are formed on high-concentration N-type impurity regions 14, which are coupled to bitline 15. Though not shown in the drawings, high-concentration impurity regions 14 may be formed on the active regions between wordlines 12, and coupled to every other bitline 15.

A method for fabricating the second embodiment of the present invention will be now explained.

Figure 17A:
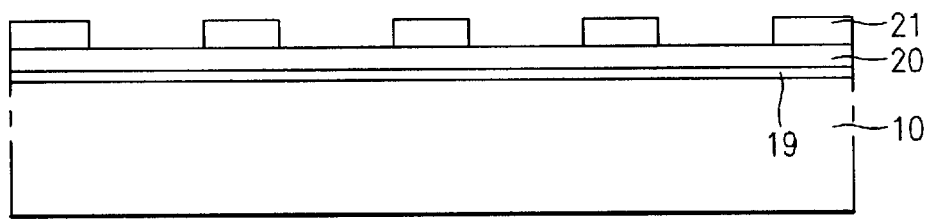
Figure 18A:
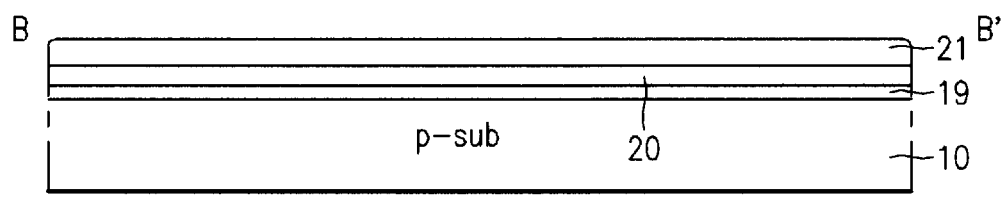
FIGS. 18a–18i are sectional views of the sequential process of the second embodiment of the semiconductor memory device of the present invention cut along line B-B' of FIG. 14.

Referring to FIGS. 17a and 18a, buffer oxide layer 19, nitride layer 20 and photosensitive layer 21 are deposited sequentially on P-type semiconductor substrate 10, and the field regions and active regions are defined by photolithography so that the pattern of photosensitive layer 21 is formed only above the active regions.

Figure 17B:
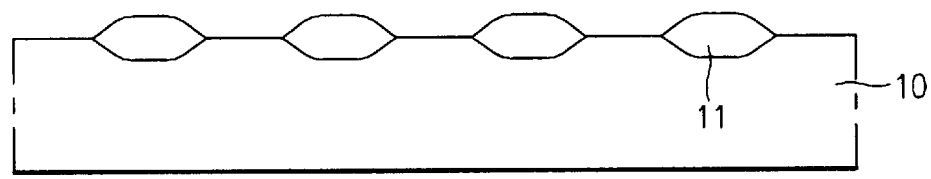
Figure 18B:
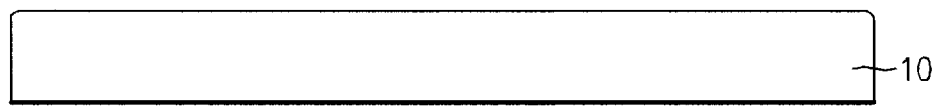

Referring to FIGS. 17b and 18b, nitride layer 20 is selectively removed by using the pattern of photosensitive layer 21 as a mask and thermally treated under the atmosphere of oxygen so that field insulating layer (field oxide layer) 11 is formed on the field region. Then, photosensitive layer 21, nitride layer 20, and buffer oxide layer 19 are removed.

Figure 17C:
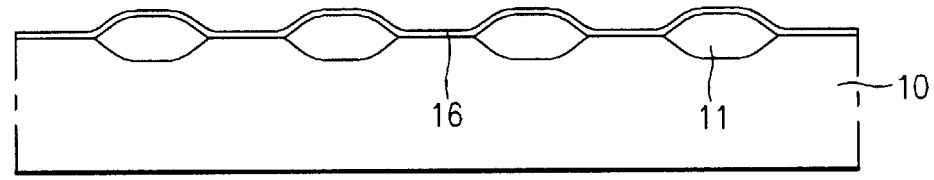
Figure 18C:
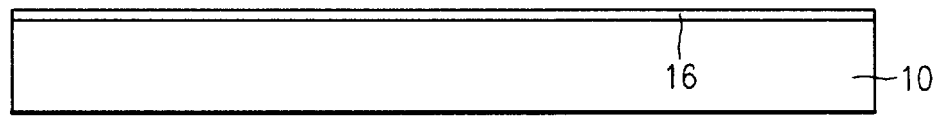

Referring to FIGS. 17c and 18c, tunnelling dielectric layer 16 is formed on P-type semiconductor substrate 10 on which field insulating layer 11 is formed. Here, the thickness of tunnelling dielectric layer 16 is 70–150Å.

Figure 17D:
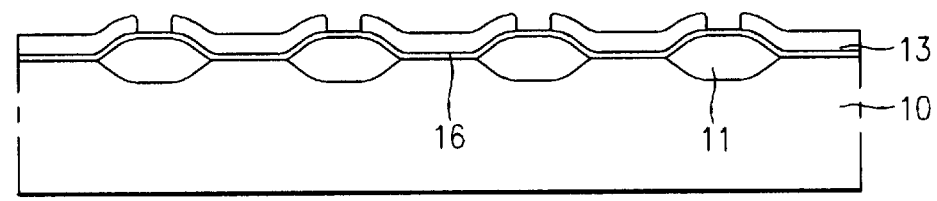
Figure 18D:
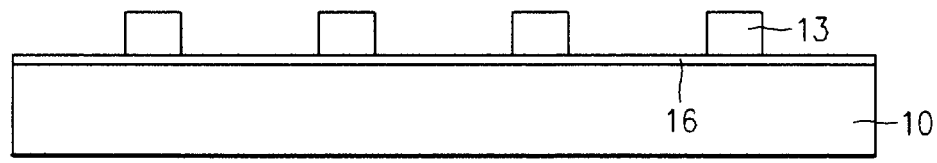

Referring to FIGS. 17d and 18d, polysilicon is deposited on tunnelling dielectric layer 16, and floating gates 13 are formed on tunnelling dielectric layer 16 of the active regions by photolithography and etching. Here, floating gates 13 may be formed of metal.

Figure 17E:
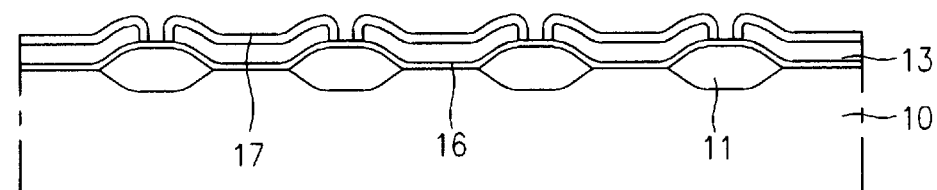
Figure 18E:
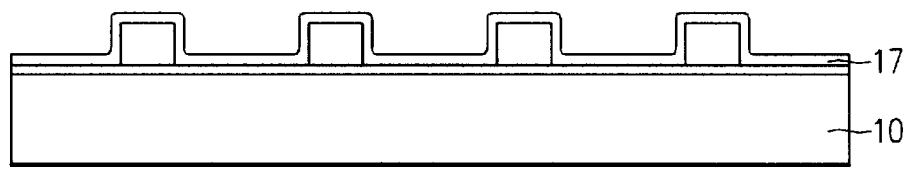

Referring to FIGS. 17e and 18e, ferroelectric layer 17 is deposited on the overall surface of the substrate including floating gates 13. Here, ferroelectric layer 17 is formed of an oxide layer, an oxide/nitride or oxide/nitride/oxide stack, or PZT.

Figure 18F:
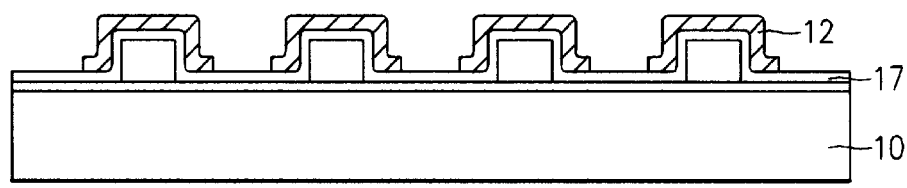

In FIGS. 17f and 18f, polysilicon is deposited on the overall surface of ferroelectric layer 17 and selectively removed by photolithography and etching so that wordlines 12 are formed above floating gates 13. Here, wordlines 12 are formed perpendicular to field insulating layer 11. One row of floating gates 13 are formed to be embraced by wordlines 12. The floating gates may be formed of metal instead of polysilicon.

Figure 18G:
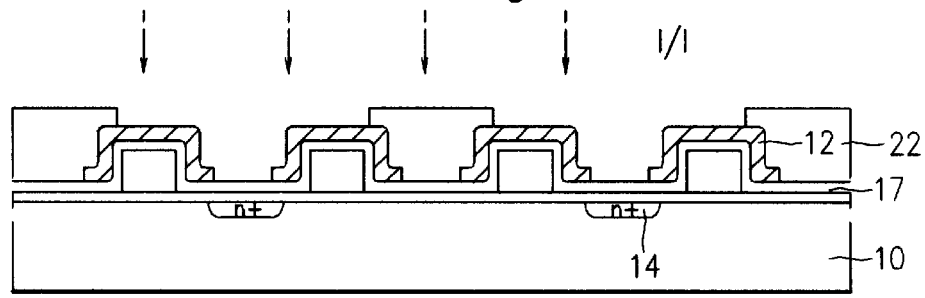

Turning to FIGS. 17g and 18g, photosensitive layer 22 is deposited on the overall surface of the substrate including wordlines 12, and the pattern of photosensitive layer 22 is formed by exposure and development. Here, the pattern of photosensitive layer 22 is made to define the top of every other active region between wordlines 12. Using the pattern of photosensitive layer 22 as a mask, N-type impurity ions are heavily implanted onto P-type semiconductor substrate 10 of the defined active region, thereby forming high-concentration N-type impurity region 14.

Figure 18H:
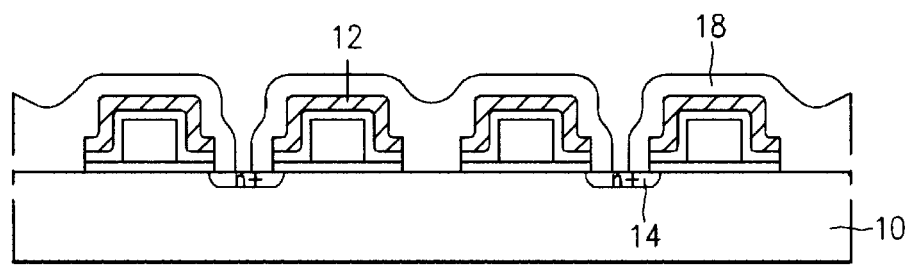

Referring to FIGS. 17h and 18h, interlevel insulating layer 18 is deposited on the overall surface of the substrate including wordlines 12, and tunnelling dielectric layer 16, ferroelectric layer 17 and interlevel insulating layer 18 are selectively removed, thereby exposing high-concentration N-type impurity region 14 of FIG. 18h and forming a contact hole.

Figure 18I:
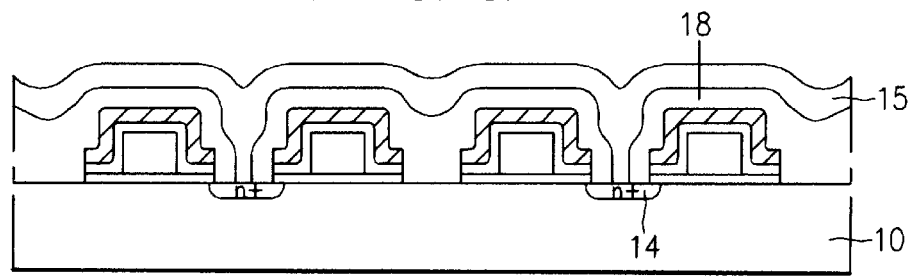

Referring to FIGS. 17i and 18i, polysilicon is deposited on interlevel insulating layer 18 and selectively removed by photolithography and etching, thereby forming bitlines 15 to be electrically coupled to high-concentration N-type impurity region 14. Here, bitlines 15 may be formed of metal.

The operation of the semiconductor memory device of the present invention described as above will now be explained.

Figure 20:
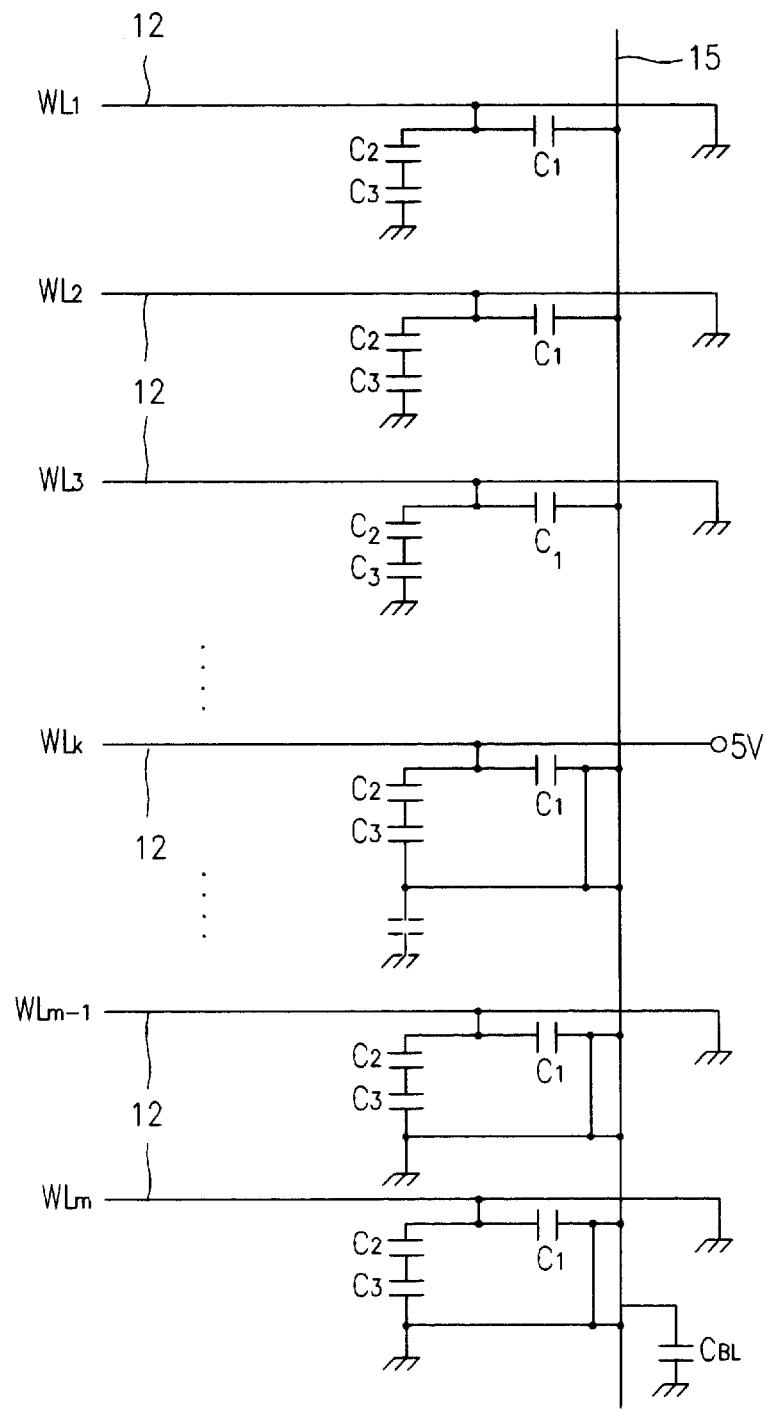
FIG. 20 shows a capacitor response circuit when data "1" is read in the semiconductor memory device.

Referring to FIGS. 19 and 20, a data programming operation will be described first. A voltage of 3–5V is applied to bitlines 15 coupled to cells not to be programmed in order to prevent programming. Bitlines 15 to be programmed are grounded. A pulse of 12–15V is applied to wordlines 12 of cells into which data "0" is written. Wordlines 12 of cells in which data "1" is written are grounded.

In cells whose bitlines 15 are grounded and to whose wordlines 12 a pulse of 12–15V is applied, a voltage of 12–15V is applied to the channel between control gate C.G, that is, wordline, and semiconductor substrate 10. According to Fowler-Nordheim tunnelling, charges of the semiconductor substrate pass through tunneling dielectric layer 16 and are then stored in floating gate 13. In this procedure, data "0" is written.

In cells whose bitlines 15 and wordlines 12 are grounded, no voltage is applied to the channel between control gate C.G, that is, wordline, and semiconductor substrate 10. Charges of the semiconductor substrate are not stored in floating gate 13 and thus write data "1". Here, in cells of bitlines 15 to which a voltage of 3–5V is applied in order to prevent programming, the channel region is inverted even when a pulse of 12–15V is applied to wordlines 12, and a voltage of 3–5V is applied to bitlines 15 so that a voltage sufficient to enable tunneling to floating gate 13 from semiconductor substrate 10 is not applied between wordlines 12 and the substrate and thus charges are not implanted in floating gate 13. After programming of cells connected in one row is finished, cells of another row are programmed sequentially according to the above-stated method.

Programming can be performed in another method. Specifically, a pulse of 3–5V is applied to the bitline of a cell in which data "0" is to be written, and the bitline of a cell in which data "1" is to be written is grounded. Wordlines connected to cells not to be not programmed are grounded in order to prevent programming. A voltage of 12V is applied only to wordlines of rows to be programmed. In floating gate 13 of cells to whose bitline 15 a voltage of 3–5V is applied and to whose wordline 12 a voltage of 12V is applied, charges are accumulated due to tunneling, and the remainder is not stored.

In data erasure, all wordlines 12 are grounded and a voltage of 13–15V is applied to the substrate. The charges stored in floating gate 13 are emitted to the substrate from floating gate 13 via tunneling dielectric layer 16 due to tunneling.

Next, a reading operation will now be described.

The system is enabled to read all cells coupled to one wordline 12 at the same time. If necessary, however, some cells can be selected for reading. Bitlines 15 to which cells to read are coupled are precharged to a predetermined voltage (for instance, 0V). To wordlines 12 to which cells to read are coupled, a predetermined voltage, for instance, 5V, is applied. Except wordlines 12 to which cells to be read are coupled, all wordlines 12 are grounded.

Whether data "0" or "1" is programmed in the respective cells, the voltages of bitlines 15 coupled to the respective cells becomes different. Reading is performed when this voltage difference is detected through the sensing AMPs. The voltage differences of bitlines coupled to a cell are calculated and data "0" or data "1" is written in the cell.

First, when data "0" is written in the cell, a predetermined amount of charges, that is, negative charges, are stored in floating gate 13. In this state, as shown in a general stacked gate flash EEPROM, the threshold voltage is increased over 7V when measured in the control gate, that is, wordline 12, because negative charges are accumulated in the floating gate. Therefore, even when a voltage pulse of 5V is applied, an inversion layer is not formed in the cell's channel region. In addition, as shown in FIG. 5a, charges are not emigrated to the cell's channel region from bitlines 15. Wordlines of other cells coupled to the cell's bitlines 15 are grounded so that they are all turned OFF regardless of whether they are programmed with data "0" or "1".

The capacitor response circuit of the bitlines coupled to the cells is roughly shown in FIG. 19. In FIG. 19, voltage $V_{BL("0")}$ output to the sensing AMPs via the bitlines from the cell where data "0" is written by capacitor coupling is given as equation (1).

$$V_{BL("0")} = 5V \cdot C1/(MC1 + C_{BL}) \tag{1}$$

where C1 is a capacitance produced when wordline 12 and impurity region 14 are overlapped, C2 is a capacitance between wordline 12 and floating gate 13, C3 is a capacitance between floating gate 13 and semiconductor substrate 10, M is the number of cells coupled to one bitline, and $C_{BL}$ is a junction capacitance between all impurity regions coupled to one bitline and the semiconductor substrate.

Second, when data "1" is written in the cell, charges are not accumulated in floating gate 13 so that a threshold voltage measured at wordline 12 is lowered to about 1–2V. After 5V of voltage pulse is applied to wordline 12, a strong inversion layer is formed in the channel of the substrate corresponding to the cell so that the voltage of bitline 15 is applied to the channel region of the cell, as shown in FIG. 5B. In this case, the capacitor response circuit of the bitline is shown as in FIG. 20.

$V_{BL("1")}$ output to the sensing AMP by the cell via the bitline is roughly expressed as in equation (2).

$$V_{BL("1")} = 5V \cdot (C1+C2//C3)/(MC1+C_{BL}+C2//C3) \qquad (2)$$

where $C2//C3 = C2 \times C3/(C2+C3)$.

From equations (1) and (2), voltage $\Delta V_{BL}$ is expressed as follows.

$$\Delta V_{bit} = V_{BL("1")} - V_{BL("0")} = 5V \cdot (C1+C2//C3)/(MC1+C_{BL}+C2//C3) \qquad (3)$$

In equation (3), if $(C2//C3) \approx 10\ C1$, the number of cells is 1,000, and $C_{BL}$ is ignored, $$\Delta V_{bit} = 5V \cdot 10C1/(1,000C1+10C1) = 50/1010 \approx 50\ mV \qquad (4)$$

As a result, the difference between the voltage when data "0" is written and the voltage when data "1" is written is as indicated in equation (4). In a general sensing AMP, reading data "1" or data "0" is enabled when there is a voltage difference of about 20 mV. Therefore, the present invention is sufficiently capable of reading data.

As described above, the semiconductor memory device of the present invention involves the following advantages.

First, when data stored in the cell is erased, the control gate is grounded and a voltage pulse of 12–15V is applied to the substrate so that charges accumulated in the floating gate are discharged to the substrate therefrom. This hardly produces hot holes on the substrate in erasure, solving the overerasure problems.

Second, for the conventional ETOX flash EEPROM, the source junction is formed deeply in order to prevent hot holes, thereby increasing the size of unit cell. However, in the present invention, the junction is not deeply formed and only one impurity region coupled to the bitlines is formed for every unit cell, thereby sharply reducing the area of unit cell and therefore enhancing the packing density.

Third, in the conventional ETOX flash EEPROM, a programming voltage applied to the bitlines is generally 6–8V. In the present invention, a programming voltage applied to the bitlines is a maximum of 5V so that loss of charges stored in the floating gate can be prevented in programming.

Fourth, for the conventional ETOX flash EEPROM, programming is performed by channel hot electron injection so that a current of 10 $\mu$A runs through cells. In the present invention, programming is performed by Fowler Nordheim tunnelling so that a current of several pA flows.

Fifth, the unit cell of the present invention is made with a stacked gate-MOS capacitor, requiring no channel for carrying charges and thus preventing punch-through between source and drain. Accordingly, the doping concentration of the impurity region is more sharply reduced than that of MOSFET, thereby greatly reducing junction capacitance for every cell.

It will be apparent to those skilled in the art that various modifications and variations can be made in the semiconductor memory device of the present invention without departing from the spirit or scope of the invention. Thus, it is intended that the present invention cover the modifications and variations of this invention provided they come within the scope of the appended claims and their equivalents.

What is claimed is:

1. A semiconductor memory device comprising;

a semiconductor substrate of a first conductivity-type having a field region;

a field insulating layer formed on the field region so that a plurality of active regions are formed in one direction at predetermined intervals;

a plurality of charge input/output stages formed on the semiconductor substrate of the active regions at predetermined intervals;

a tunnelling dielectric layer formed on the semiconductor substrate, the tunnelling dielectric layer having a contact hole in the charge input/output stage;

a plurality of floating gates formed in a matrix arrangement on the tunnelling dielectric layer above the active regions between the charge input/output stages;

a ferroelectric layer formed on the surface of the semiconductor substrate including the floating gates, the ferroelectric layer having a contact hole at the charge input/output stage;

a plurality of wordlines each formed on the ferroelectric layer above the floating gates perpendicular to the active regions;

an interlevel insulating layer formed on the wordlines, the interlevel insulating layer having a contact hole in the charge input/output stage; and a plurality of bitlines formed on the interlevel insulating layer to electrically connect the charge input/output stages formed on the same active region.

2. The semiconductor memory device as claimed in claim 1, wherein two floating gates are formed on the tunnelling dielectric layer above the active regions placed between the charge input/output stages.

3. The semiconductor memory device as claimed in claim 1, wherein the tunnelling dielectric layer, ferroelectric layer and interlevel insulating layer are formed to have a contact hole for every other charge input/output stage.

4. The semiconductor memory device as claimed in claim 1, wherein the tunnelling dielectric layer is formed of PZT.

5. The semiconductor memory device as claimed in claim 1, wherein the wordlines are formed to surround the respective floating gates.

6. The semiconductor memory device as claimed in claim 1, wherein the tunnelling dielectric layer has a thickness of 70–150Å.

7. The semiconductor memory device as claimed in claim 1, wherein the ferroelectric layer includes one of an oxide layer, an oxide/nitride stack or an oxide/nitride/oxide stack, or PZT.

* * * * *